(12) United States Patent
Polizzi et al.

(10) Patent No.: US 6,240,002 B1
(45) Date of Patent: May 29, 2001

(54) CONTENT ADDRESSABLE MEMORY PROTECTION CIRCUIT AND METHOD

(75) Inventors: Salvatore Polizzi, S.G. la Punta; Raffaele Solimene, Catania, both of (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/561,271

(22) Filed: Apr. 28, 2000

(30) Foreign Application Priority Data

May 1, 1999 (EP) .................................... 99201363

(51) Int. Cl.[7] .................................................. G11C 15/00
(52) U.S. Cl. ........................................ 365/49; 365/189.05
(58) Field of Search ................................. 365/49, 189.05, 365/185.01; 327/199, 200, 208

(56) References Cited

U.S. PATENT DOCUMENTS

| | | | |
|---|---|---|---|
| 5,638,326 | 6/1997 | Hollmer et al. | 365/185.2 |
| 5,668,483 | 9/1997 | Roohparvar | 326/34 |
| 5,859,797 | * 1/1999 | MacCarrone et al. | 365/185.25 |
| 5,978,262 | * 11/1999 | Marquot et al. | 365/185.01 |
| 6,127,855 | * 10/2000 | Taft et al. | 327/91 |

FOREIGN PATENT DOCUMENTS

| | | |
|---|---|---|
| 0609893A2 | 8/1994 | (EP) . |
| 03230617 | 1/1992 | (JP) . |

* cited by examiner

Primary Examiner—Vu A. Le
Assistant Examiner—Anh Phung
(74) Attorney, Agent, or Firm—Theodore E. Galanthay; Robert Iannucci; Seed IP Law Group PLLC

(57) ABSTRACT

A content addressable memory (CAM) protection circuit includes a memory cell having a read terminal for reading contents of the memory cell; a pass transistor coupled to the read terminal; and a latch having a first inverter with an input terminal and an output terminal coupled to the read terminal by the pass transistor and a second inverter with input and output terminals respectively coupled to the output and input terminals of the first inverter. The first inverter includes a pull-down transistor coupled between the output terminal of the first inverter and a first voltage reference and having a control terminal coupled to the input terminal of the latch and a pull-up transistor coupled between the output terminal of the first inverter and a second voltage reference and having a control terminal coupled to the input terminal of the latch. Unlike prior art designs, the first inverter further includes a bias transistor coupled with the pull-up transistor between the output terminal and the second voltage reference. Preferably, the CAM protection circuit further includes a bias circuit coupled to a control terminal of the bias transistor wherein the bias circuit includes a first current mirror leg coupled between the first and second voltage references and having a control node coupled to the control terminal of the bias transistor, thereby forming a current mirror with the bias transistor and pull-up transistor being part of a second mirror leg of the current mirror.

17 Claims, 6 Drawing Sheets

CONTENT ADDRESSABLE MEMORY PROTECTION CIRCUIT AND METHOD

TECHNICAL FIELD

The invention relates to a content addressable memory (CAM) protection circuit for protecting nonvolatile memory, such as flash memory, from being programmed or erased inadvertently. In particular, the present invention relates to a CAM protection circuit that includes a memory cell that stores the status of protection of the associated nonvolatile memory, a latch for reading the memory cell, and a pass transistor that connects the latch to the memory cell.

BACKGROUND OF THE INVENTION

Nonvolatile semiconductor memories, particularly flash memories, include a CAM protection circuit associated with each sector of the memory. The CAM protection circuit stores an indication of whether the associated sector is protected from programming/erasing. An associated logic circuit reads the information stored in the CAM protection circuit each time a user requests erasing or programming of the sector. The logic circuit enables or disables the program/erase operation depending on the information stored in the CAM protection circuit.

A prior art CAM protection circuit 10 is shown in FIG. 1. Each sector of a flash memory (not shown) is associated with such a CAM protection circuit 10. The CAM protection circuit includes first and second flash memory cells 12, 14, a latch 16, and a pass transistor 18 connecting the latch 16 to the memory cells 12,14. When the sector associated with the CAM protection circuit 10 is programmed, the flash memory cells 12,14 are programmed with a bit indicating whether the sector is protected from erasing and programming.

The first memory cell 12 includes drain and source terminals connected respectively to gate, drain, and source terminals of the second memory cell 14. The gate terminals of the memory cells 12,14 are coupled to a control signal WL and the source terminals are connected to a voltage reference Source, which is ground when the memory cells are read by the latch 16. The drain terminals of the memory cells 12,14 coupled to a source terminal of the pass transistor 18, which has a gate terminal connected to a voltage reference VB and a drain terminal connected to the latch 16. The reference voltage VB, which is relatively insensitive to variations in the supply voltage Vdd, biases the drain terminals of the memory cells 12,14 to a voltage VB minus Vth (threshold voltage of the pass transistor 18).

The latch 16 includes a first inverter 20 having in input coupled to an input terminal 22 of the latch and an output coupled to an output terminal 24 of the latch. The latch 16 also includes a second inverter 26 having in input coupled to the output terminal 24 and an output coupled to the input terminal 22. The output terminal 24 also is coupled to a logic circuit (not shown) that reads the status information stored in the CAM protection circuit 10 and determines from that status information whether to allow programming or erasing of the corresponding sector of the memory. Also coupled to the input terminal 22 of the latch 16 is the drain terminal of a reset transistor 28 having a source terminal coupled to ground and a gate terminal coupled to a reset signal.

The first and second inverters 20,26 are substantially identical, and therefore for simplicity, only the first inverter 20 will be described in detail. The first inverter 20 includes a pull-down transistor 30 having a source terminal coupled to ground, a drain terminal coupled to the output terminal 24 of the latch and a gate terminal coupled to the input terminal 22 of the latch. The first inverter 20 also includes a pull-up transistor 32 having a drain terminal coupled to a source voltage Vdd, a source terminal coupled to the output terminal 24 of the latch 16 and a gate terminal coupled to the input terminal 22 of the latch.

When the device that includes the nonvolatile memory and the CAM protection circuit 10 is turned on, the reset signal goes high which turns on the reset transistor 28 thereby causing the latch 16 to initially assume a high logic state at the output terminal 24. When the user desires to program or erase the corresponding memory sector, the gates of the first and second memory cells 12,14 are biased by the signal WL and the sources are brought to ground. If the memory cells 12,14 are erased, current is drawn from the pull-up transistor 32 through the pass transistor 18 and the memory cells to ground. This switches the latch 16 (the output terminal 24 goes to a low logic state), which means that the corresponding sector is unprotected. If the memory cells 12,14 are programmed, there is no current drawn and the latch 16 does not change logic status, which means that the corresponding sector remains protected.

In this type of circuit 10, is important that the pull-up transistor 32 be sufficiently resistive to guarantee a relatively easy switching. However, to have a trip point (inversion voltage of the latch 16) sufficiently central between the supply voltage Vdd and ground, the other components of the latch should be dimensioned appropriately.

One problem with the CAM protection circuit 10 is that if the supply voltage Vdd is sufficiently high, the current through the memory cells 12,14 may not be sufficient to switch the logic state of the latch 16. FIG. 2 shows the current through the pull-up transistor 32 necessary for switching the latch 16 for various values of the supply voltage Vdd. FIG. 2 shows that for supply voltages Vdd ranging from 2.5 to 7.5, the necessary current for tripping ranges from 6.67 $\mu$A to 73.6 $\mu$A. It can happen that the current drawn by the memory cells 12,14 is not sufficient to an enable such tripping currents to be obtained.

One could think of resolving the problem by resizing of the latch 16 or augmenting the number of memory cells 12,14. In the first case, making the pull-up resistor 32 more resistive, one would make the latch 16 too sensitive to noise, by excessively lowering its trip point. In the second case, more time would be needed for the erasing and programming the memory cells, not to mention the addition to the silicon space occupied by the protection circuit 10.

A technical problem addressed by the present invention is to create a CAM protection circuit with a latch that can successfully switch logic states even at high supply voltages.

SUMMARY OF THE INVENTION

One of the features of embodiments of the invention is to drive a consistent current that is substantially independent of the supply voltage through a latch of a CAM protection circuit.

Presented, therefore, is a content addressable memory protection circuit that has a memory cell with a reading terminal for reading the contents of the memory and a pass transistor coupled to the read terminal. Additionally included is a latch that has a first inverter coupled to the read terminal by the pass transistor and a second inverter coupled to output and input terminals of the first inverter. The first inverter has a pull-down transistor coupled between the first inverter and a first voltage reference, a control terminal coupled to the latch, a pull-up transistor coupled between the first inverter and a second voltage reference, and a control terminal coupled to an input terminal of the latch. Additionally, the first inverter includes a bias transistor coupled with the pull-up transistor between the output terminal and the second voltage reference.

The features and advantages of the circuit and method according to this invention will be apparent from the following description of an embodiment thereof, given by way of non-limitative example with reference to the accompanying drawings.

DETAILED DESCRIPTION OF THE INVENTION

Figure 3:
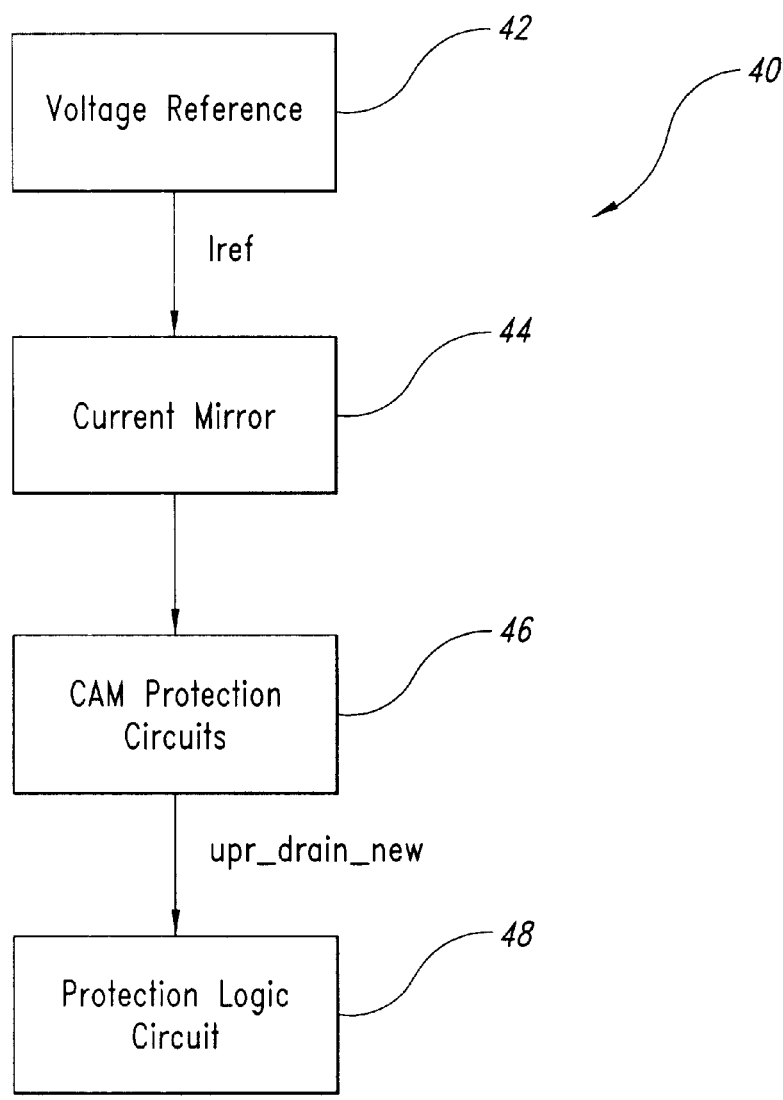
FIG. 3 is a block diagram of a CAM protection system according to an embodiment of the present invention.

A CAM protection system 40 according to an embodiment of the present invention is shown in FIG. 3. The CAM protection system 40 includes a voltage reference block 42 that produces a voltage reference Iref. Such a voltage reference block 42 typically already exists as part of the memory circuit that includes the semiconductor memory being protected. In contrast to prior art CAM protection systems, however, the CAM protection system 40 also includes a current mirror 44 that produces a mirrored current in each CAM protection circuit of a set of CAM protection circuits generally referenced by 46. The set 46 of CAM protection circuits includes a respective CAM protection circuit for each sector of the nonvolatile memory being protected. Each CAM protection circuit stores protection information regarding whether the corresponding memory sector is protected from programming and erasing. Each CAM protection circuit of the set 46 is coupled to a protection logic circuit 48 that reads the protection information stored in the CAM protection circuit and enables or disables programming and erasing of the corresponding memory sector based on that protection information.

Figure 4:
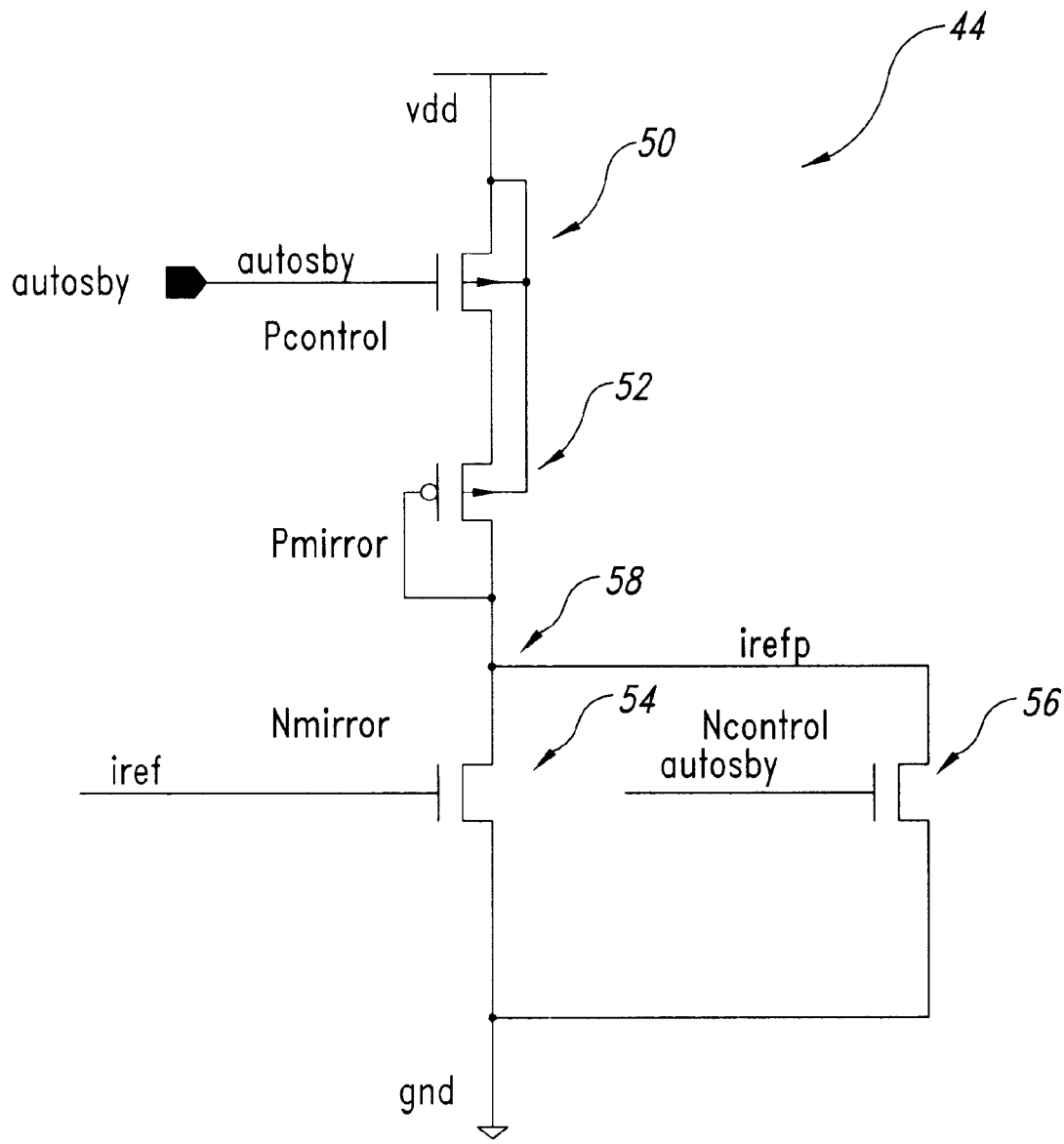
FIG. 4 is a circuit diagram of a current mirror used in the CAM protection system of FIG. 3.

A circuit diagram of the current mirror 44 is shown in FIG. 4. The current mirror 44 includes a PMOS control transistor 50, a PMOS mirror transistor 52, and an NMOS mirror transistor 54 connected in series between a voltage supply Vdd and ground. An NMOS control transistor 56 has a drain terminal connected to a drain terminal of the NMOS mirror transistor 54 at an output node 58 and a source terminal connected to ground. The PMOS mirror transistor 52 is diode connected with its gate terminal connected to its drain terminal. The control transistors 50, 56 have their gates connected to a control signal autosby and the NMOS mirror transistor has its gate coupled to the current reference iref.

In response to a request by a user to program or erase a memory sector, the control signal autosby goes low and the voltage reference Iref goes high. This activates the PMOS control transistor 50 and the NMOS mirror transistor 54 and inactivates the NMOS control transistor 56. As a result, a voltage develops at the output node 58 which is intermediate of the supply voltage Vdd and ground.

When no programming or erasing of the nonvolatile memory is being requested, the current mirror goes into a standby condition in which the control signal autosby goes high and the voltage of the current reference iref goes low. This inactivates the PMOS control transistor 50 and the NMOS mirror transistor 54 and activates the NMOS control transistor 56. As a result, the output node 58 is connected to ground through the NMOS control transistor 56, and thus, assumes a lower voltage than when programming or erasing is being requested.

Figure 5:
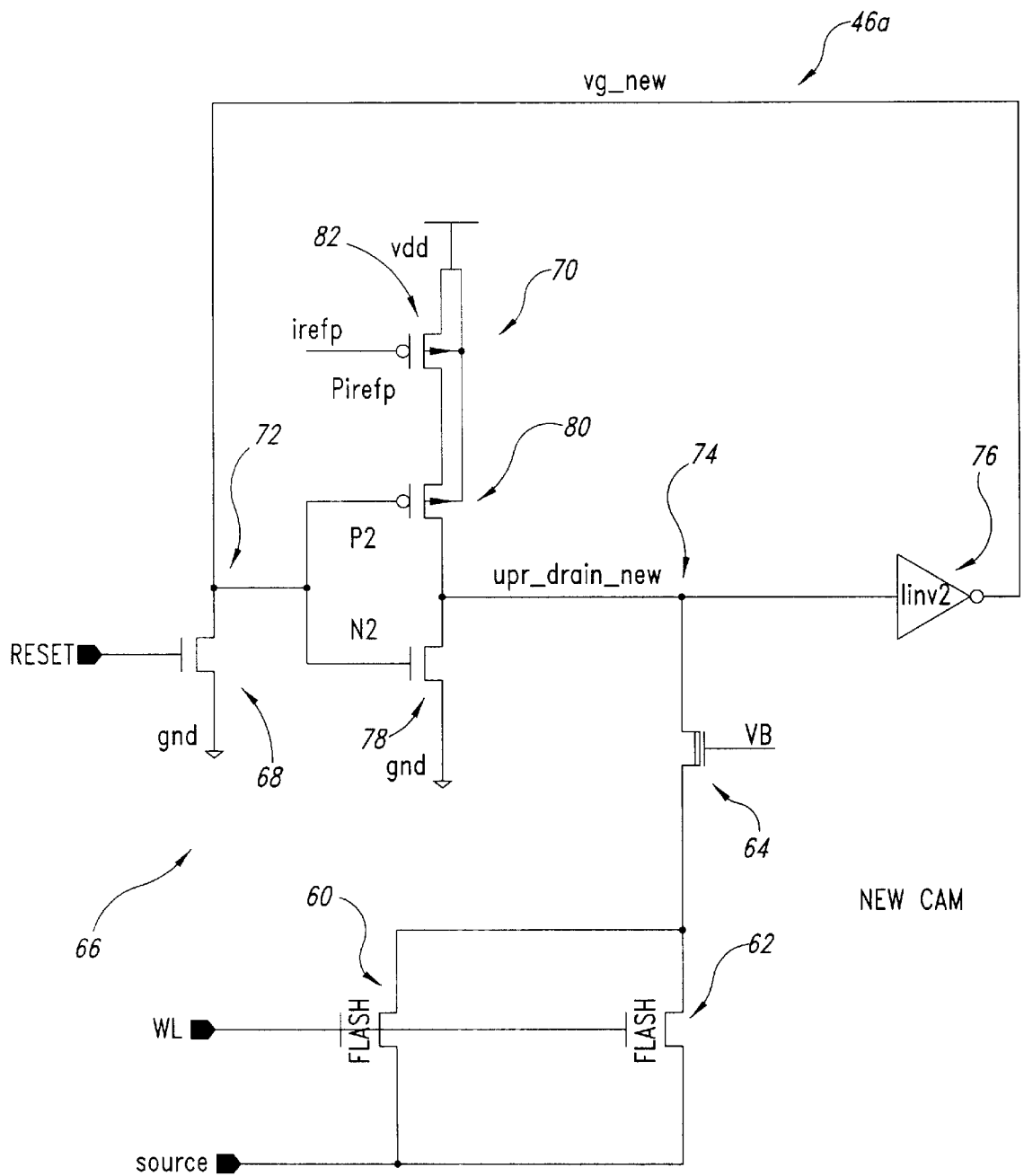
FIG. 5 is a circuit diagram of a CAM protection circuit used in the system of FIG. 3.

A CAM protection circuit 46A (any one of the CAM protection circuits of the set 46 shown in FIG. 3) is shown in FIG. 5. Like the prior art CAM protection circuit 10 shown in FIG. 1, the CAM protection circuit 46A includes first and second flash memory cells 60, 62, an NMOS pass transistor 64, a latch 66, and a reset transistor 68. Unlike the prior art CAM protection circuit 10, the CAM protection circuit 46A is coupled to the current mirror circuit 44 of FIG. 4, as will be explained in more detail below.

The first memory cell 60 includes drain and source terminals connected respectively to gate, drain, and source terminals of the second memory cell 62. The gate terminals of the memory cells 60,62 are coupled to a control signal WL and the source terminals are connected to a voltage reference Source, which is ground when the memory cells are read by the latch 66. The drain terminals of the memory cells 60,62 coupled to a source terminal of the pass transistor 18, which has a gate terminal connected to a voltage reference VB and a drain terminal connected to the latch 66. The reference voltage VB, which is relatively insensitive to variations in the supply voltage Vdd, biases the drain terminals of the memory cells 60,62 to a voltage VB minus Vth (threshold voltage of the pass transistor 64).

The latch 66 includes a first inverter 70 having in input coupled to an input terminal 72 of the latch and an output coupled to an output terminal 74 of the latch. The latch 66 also includes a second inverter 76 having in input coupled to the output terminal 74 and an output coupled to the input terminal 72. The output terminal 74 also is coupled to the protection logic circuit 48 (FIG. 3) that reads the status information stored in the CAM protection circuit 46A and determines from that status information whether to allow programming or erasing of the corresponding sector of the memory. Also coupled to the input terminal 72 of the latch 66 is the drain terminal of the reset transistor 68 having a source terminal coupled to ground and a gate terminal coupled to a reset signal.

The first inverter 70 includes an NMOS pull-down transistor 78 having a source terminal coupled to ground, a drain terminal coupled to the output terminal 74 of the latch and a gate terminal coupled to the input terminal 72 of the latch. The first inverter 70 also includes a PMOS pull-up transistor 80 having a drain terminal, a source terminal coupled to the output terminal 74 of the latch 66 and a gate terminal coupled to the input terminal 72 of the latch.

Figure 1:
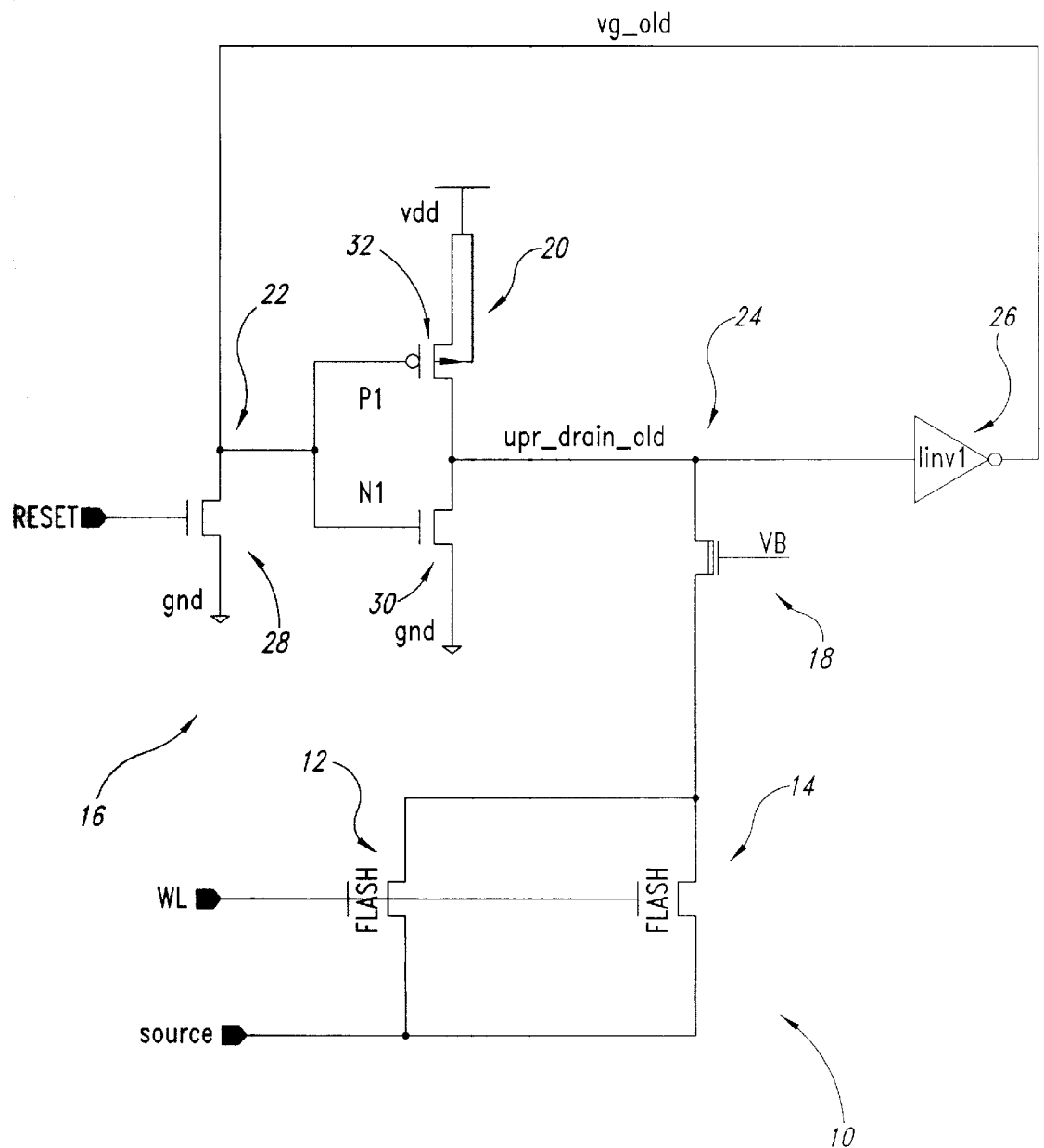
FIG. 1 is a circuit diagram of a prior art CAM protection circuit.

Unlike the first inverter 20 of the prior art CAM protection circuit 10 shown in FIG. 1, the first inverter 70 also includes a PMOS bias transistor 82 having a source terminal coupled to the supply voltage Vdd, a drain terminal coupled to the source terminal of the pull-up transistor 80, and a gate terminal coupled to the output node 58 of the current mirror circuit 44 of FIG. 4. Via the connection between the output node 58 and the gate terminal of the bias transistor 82, the current mirror circuit 44 biases the bias transistor 82 in such a manner that the current drawn through the bias transistor 82 and the pull-up transistor 80 is substantially independent of the supply voltage Vdd. As a result, the memory cells 60, 62 are able to draw enough current to switch the latch 66 even at high values of the voltage supply Vdd.

When the device that includes the nonvolatile memory and the CAM protection circuit 46A is turned on, the reset signal goes high which activates the pull-up transistor 80 of the first inverter 70 via the reset transistor 68. The control signal autosby also goes high which activates the bias transistor 82 by coupling the gate of the bias transistor 82 to ground via the NMOS control transistor 56 of the current mirror 44. With both of the pull-up and bias transistors 80, 82 being activated, the latch 66 initially assumes a high logic state at the output terminal 74.

When the user desires to program or erase one of the memory sectors, the control signal autosby and the voltage of the current reference iref go high, which activates the PMOS control transistor 50 and the NMOS mirror transistor 54 and deactivates the NMOS control transistor 56. In addition, the gates of the first and second memory cells 60,62 are biased by the signal wl and the sources are brought to ground, which, if the memory cells 60,62 are erased, current is drawn through the memory cells to ground. Given the coupling of the gates of the PMOS mirror transistor 52 and the bias transistor 82, a current mirror is formed with one leg of the current mirror consisting of the PMOS control transistor 50, PMOS mirror transistor 52, and NMOS mirror transistor 54 and another leg of the current mirror consisting of the memory cells 60, 62, pass transistor 64, pull-up transistor 80, and bias transistor 82.

Due to the formation of that current mirror, the current through the second leg (transistors 60, 62, 64, 80, 82) of the current mirror will be set by the current through the first leg (transistors 50, 52, 54) substantially independent of the value of the voltage supply Vdd. Therefore, the addition of the current mirror circuit 44 and the bias transistor 82 assures that the current through the memory cells 60, 62 will always be sufficient to switch the logic state at the output terminal 74 of the latch when the memory cells are erased regardless of the value of the voltage supply Vdd. Thus, the user can be assured that the protection logic circuit 48 will reliably read from the output terminal 74 of the latch 66 the correct protection state stored in the memory cells 60, 62 when that protection state is an unprotected protection state (indicated by the erased state of the memory cells). If the memory cells 60,62 are programmed, there is no current drawn and the latch 66 does not change logic status, which means that the corresponding sector remains protected.

Figure 2:
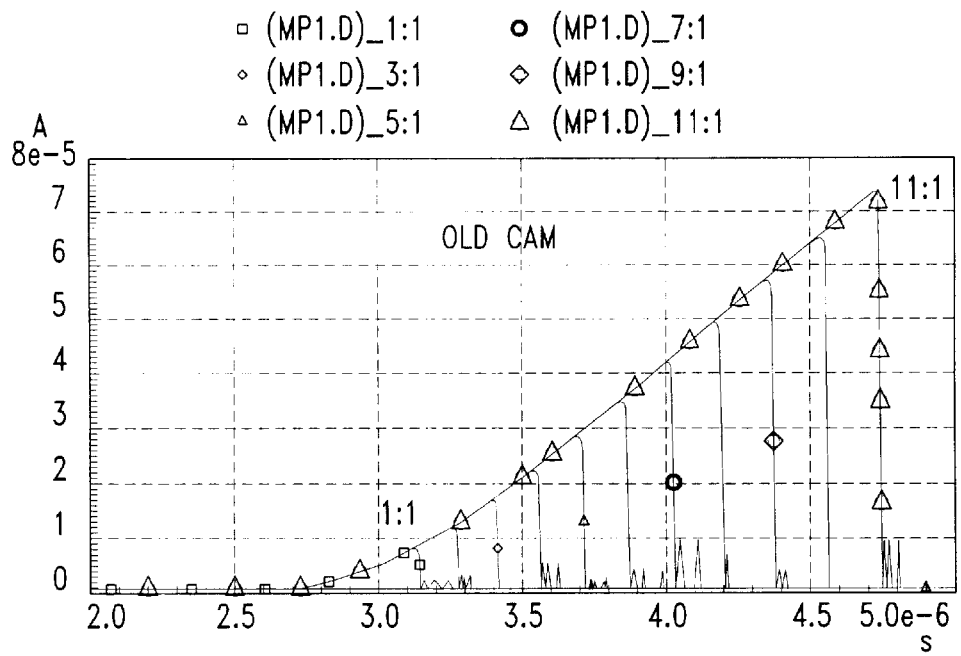
FIG. 2 is a graph showing latch tripping currents and times for several supply voltages using the prior art circuit of FIG. 1.
Figure 6:
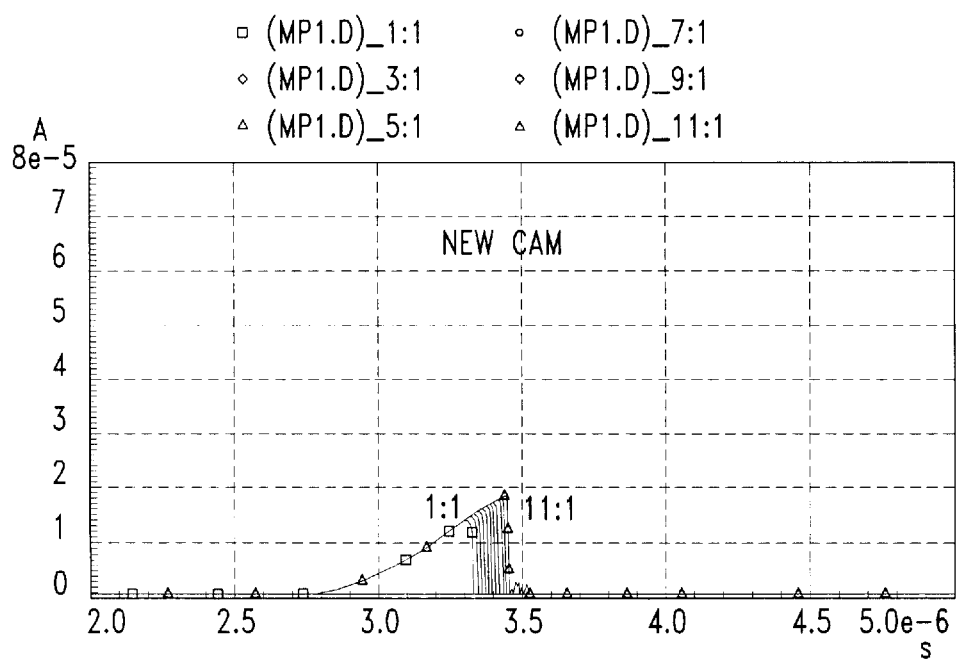
FIG. 6 is a graph showing latch tripping currents and times for several supply voltages using the circuit of FIG. 5.

FIG. 6 shows the currents through the transistors 60–64, 80–82 needed to switch the logic state at the output terminal 74 of the latch 66 for various values of the voltage supply Vdd. For the voltage supply Vdd ranging from 2.5 to 7.5 V, the necessary current for switching the output terminal 74 ranges from 13.5 to 19.3 $\mu$A. Such a current is much less than the current needed in the prior art CAM protection circuit 10 for most of the values of the voltage supply Vdd as can be seen from a comparison of FIG. 2 with FIG. 6. In addition, a comparison of FIG. 2 with FIG. 6 shows that the variation in the tripping current needed for the various values of the voltage supply Vdd is much less in the CAM protection circuit 46A of the present invention than in the prior art CAM protection circuit 10. In fact, the variation in tripping current due to the changes in the voltage supply Vdd are so small as to make the tripping current in the CAM protection circuit 46A almost entirely independent of the supply voltage Vdd.

Figure 7:
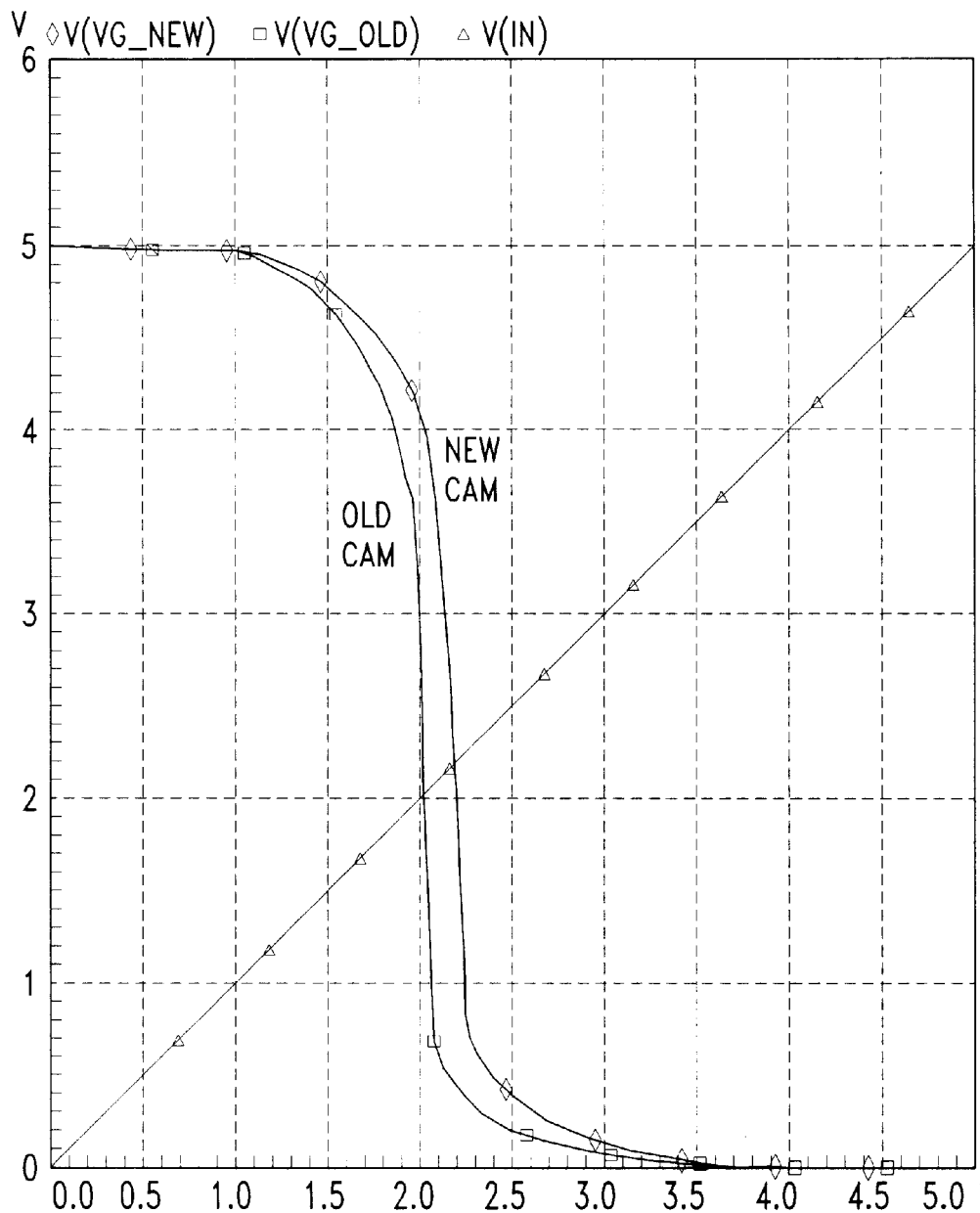
FIG. 7 is a graph showing a comparison of the voltage tripping points for the circuit of FIG. 5 and for the prior art circuit of FIG. 1.

FIG. 7 shows a comparison of the voltage tripping points of the prior art CAM protection circuit 10 and the CAM protection circuit 46A. As can be seen, the voltage tripping point for the CAM protection circuit 46A is about 2.3 V compared to about 2.1 V for the prior art design 10. Having a voltage tripping point that is more symmetrical between the voltage supply Vdd and ground enables the CAM protection circuit 46A to be less subject to noise than the prior art design 10. In addition, the CAM protection circuit 46A occupies less silicon area than the prior art design 46A because the lower tripping current of the CAM protection circuit 46A makes it unnecessary for the pull-up transistor 80 to have a long channel.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A content addressable memory protection circuit, comprising:
   a memory cell having a read terminal for reading contents of the memory cell;
   a pass transistor coupled to the read terminal; and
   a latch having a first inverter with an input terminal and an output terminal coupled to the read terminal by the pass transistor and a second inverter with input and output terminals respectively coupled to the output and input terminals of the first inverter, the first inverter including a pull-down transistor coupled between the output terminal of the first inverter and a first voltage reference and having a control terminal coupled to the input terminal of the latch, and a pull-up transistor coupled between the output terminal of the first inverter and a second voltage reference and having a control terminal coupled to the input terminal of the latch, wherein the first inverter further includes a bias transistor coupled with the pull-up transistor between the output terminal and the second voltage reference.

2. The circuit of claim 1, further comprising a bias circuit coupled to a control terminal of the bias transistor, the bias circuit being structured to bias the bias transistor with a first voltage while the latch is reading from the memory cell and with a lower second voltage during a standby condition.

3. The circuit of claim 1, further comprising a bias circuit coupled to a control terminal of the bias transistor, wherein the bias circuit includes a first current mirror leg coupled between the first and second voltage references and having a control node coupled to the control terminal of the bias transistor, thereby forming a current mirror with the bias transistor and pull-up transistor being part of a second mirror leg of the current mirror.

4. The circuit of claim 3 wherein the first current mirror leg includes first and second transistors coupled between the first and second voltage references, the first transistor having a control terminal coupled to a control signal that activates the first transistor while the latch is reading from the memory cell and disactivates the first transistor during a standby condition, and the second transistor having a control terminal coupled to the control terminal of the bias transistor.

5. The circuit of claim 4 wherein the first mirror leg also includes a third transistor coupled between the control terminal of the second transistor and the first voltage reference.

6. The circuit of claim 5 wherein the bias circuit further includes a fourth transistor coupled in parallel with the third transistor, the fourth transistor having a control terminal coupled to the control terminal of the first transistor.

7. The circuit of claim 1, further comprising a bias circuit having an output node coupled to a control terminal of the bias transistor, the bias circuit including:

a first transistor having a control terminal coupled to a control signal, a first conduction terminal coupled to the second voltage reference, and a second conduction terminal;

a second transistor having a control terminal, a first conduction terminal coupled to the second conduction terminal of the first transistor, and a second conduction terminal coupled to the control terminal of the second transistor and to the output node of the bias circuit;

a third transistor having a control terminal coupled to a current reference, a first conduction terminal coupled to the output node, and a second conduction terminal coupled to the first voltage reference; and a fourth transistor having a control terminal coupled to the control signal, a first conduction terminal coupled to the output node, and a second conduction terminal coupled to the first voltage reference.

8. A method of biasing a content addressable memory protection circuit comprising a memory cell having a read terminal for reading contents of the memory cell; a pass transistor coupled to the read terminal; and a latch having a first inverter with an input terminal and an output terminal coupled to the read terminal by the pass transistor and a second inverter with input and output terminals respectively coupled to the output and input terminals of the first inverter, the first inverter including a pull-down transistor coupled between the output terminal of the first inverter and a first voltage reference and having a control terminal coupled to the input terminal of the latch and a pull-up transistor coupled between the output terminal of the first inverter and a second voltage reference and having a control terminal coupled to the input terminal of the latch, the method including electrically connecting the pull-up transistor as part of a first leg of a current mirror having a second leg while the latch is reading the contents of the memory cell, such that driven through the first leg is a mirror current that is a reflection of a control current through the second leg.

9. The method of claim 8, further comprising electrically disforming the current mirror during a standby condition.

10. The method of claim 8 wherein the pull-up transistor is coupled to the second voltage reference through a bias transistor that has a control terminal coupled to a control terminal of a mirror transistor of a bias circuit and the act of electrically connecting the pull-up transistor includes electrically activating a control transistor of the bias circuit to electrically connect the mirror transistor to the second voltage reference.

11. A content addressable memory protection circuit, comprising:

a memory cell having a read terminal for reading contents of the memory cell;

a first inverter with an input terminal and an output terminal coupled to the read terminal, the first inverter including a first transistor coupled between the output terminal of the first inverter and a first voltage reference and having a control terminal coupled to the input terminal of the latch and a second transistor coupled between the output terminal of the first inverter and a second voltage reference and having a control terminal coupled to the input terminal of the latch;

a bias transistor coupled with the first transistor between the output terminal and the first voltage reference; and a bias circuit coupled to a control terminal of the bias transistor, the bias circuit being structured to bias the bias transistor with a first voltage while the first inverter is reading the memory cell and with a second voltage during a standby condition.

12. The circuit of claim 11, further comprising a second inverter with an input terminal and an output terminal coupled respectively to the output and input terminals of the first inverter, the first and second inverters thereby forming a latch.

13. The circuit of claim 11 wherein the bias circuit includes a first current mirror leg coupled between the first and second voltage references and having a control node coupled to the control terminal of the bias transistor, thereby forming a current mirror with the bias transistor and pull-up transistor being part of a second mirror leg of the current mirror.

14. The circuit of claim 13 wherein the first current mirror leg includes first and second mirror transistors coupled between the first and second voltage references, the first mirror transistor having a control terminal coupled to a control signal that activates the first mirror transistor while the first inverter is reading the memory cell and disactivates the first mirror transistor during the standby condition, and the second mirror transistor having a control terminal coupled to the control terminal of the bias transistor.

15. The circuit of claim 14 wherein the first mirror leg also includes a third mirror transistor coupled between the control terminal of the second mnirror transistor and the second voltage reference.

16. The circuit of claim 15 wherein the bias circuit further includes a fourth mirror transistor coupled in parallel with the third mirror transistor, the fourth transistor having a control terminal coupled to the control terminal of the first mirror transistor.

17. The circuit of claim 11 wherein the bias circuit includes:

a third transistor having a control terminal coupled to a control signal, a first conduction terminal coupled to the first voltage reference, and a second conduction terminal;

a fourth transistor having a control terminal, a first conduction terminal coupled to the second conduction terminal of the third transistor, and a second conduction terminal coupled to the control terminal of the fourth transistor and to the control terminal of the bias transistor;

a fifth transistor having a control terminal coupled to a current reference, a first conduction terminal coupled to the control terminal of the bias transistor, and a second conduction terminal coupled to the second voltage reference; and a sixth transistor having a control terminal coupled to the control signal, a first conduction terminal coupled to the control terminal of the bias transistor, and a second conduction terminal coupled to the second voltage reference.

* * * * *